United States Patent [19]

Brandstater

[11] Patent Number: 5,056,765

[45] Date of Patent: Oct. 15, 1991

[54] IMMOBILIZING DEVICE PARTICULARLY USEFUL DURING PROCESSING OR TESTING FLAT WORKPIECES

[75] Inventor: Omri Brandstater, Ramat Hasharon, Israel

[73] Assignee: Orbot Systems, Ltd., Yaune, Israel

[21] Appl. No.: 528,393

[22] Filed: May 25, 1990

[30] Foreign Application Priority Data

Jun. 6, 1989 [IL] Israel .......................................... 90545

[51] Int. Cl.5 .............................................. B65H 3/08
[52] U.S. Cl. ..................................................... 269/20
[58] Field of Search ........................ 294/64.1; 51/235; 279/3, 15; 269/21, 20; 248/362, 363; 414/627, 673, 752, 589

[56] References Cited

U.S. PATENT DOCUMENTS 3,694,894 10/1972 Jelinek et al. ........................ 294/64.1
4,869,489 9/1989 Wirz et al. ............................ 294/64.1

Primary Examiner—Robert C. Watson
Attorney, Agent, or Firm—Benjamin J. Barish

[57] ABSTRACT

An immobilizing device particularly useful during processing or testing flat workpieces includes an air-cushion unit carried at the lower end of a carrier member and having an annular skirt defining with the workpiece, an air-cushion chamber effective, when pressurized, to cause the air-cushion unit to hover over the workpiece to permit relative movement between the air-cushion unit and the workpiece and table, while immobilizing and flattening the board with respect to the table.

20 Claims, 3 Drawing Sheets 5,056,765

IMMOBILIZING DEVICE PARTICULARLY USEFUL DURING PROCESSING OR TESTING FLAT WORKPIECES

FIELD AND BACKGROUND OF THE INVENTION

The present invention relates to an immobilizing device particularly useful during the processing and/or testing of planar workpieces on a flat surface of a table. The invention is especially useful in the testing of printed circuit boards, and is therefore described below with respect to this application.

Printed circuit boards, particularly those carrying complex conductive pathways having critical dimensions, must be carefully tested before they are incorporated in the electronic equipment for which they are designed. At the present time, testing of the printed circuit boards is usually carried out on equipment which is largely automated and computerized. Such equipment generally includes a movable table for receiving the board, and electro-optic devices for scanning the board in order to locate defects. Reliable scanning requires proper mounting of the board on the table surface. Thus, the board must not only be perfectly immobilized relative to the table surface, but the board surface to be checked must be flat and parallel to the table surface in order for all details to be within the depth of focus of the optic system.

Because of the relative thinness and flexibility of printed circuit boards commonly used today, the foregoing requirements mean that the boards must be positively pressed against the table surface. The various immobilizing devices in use today for pressing the board against the table surface include: suction, spring-loaded rollers, pressure pads, relatively heavy glass plates placed on the board, and adhesive tape. However, none of these known arrangements is entirely satisfactory because they introduce handling or optic system difficulties, increase the test time, and/or reduce the inspection accuracy.

OBJECTS AND SUMMARY OF THE INVENTION

An object of the present invention is to provide an immobilizing device having advantages in the above respects. Another object of the invention is to provide an immobilizing device particularly useful during the testing of printed circuit boards.

The present invention provides an immobilizing device particularly useful for immobilizing and flattening a substantially planar workpiece on a flat surface of a table during the processing or testing of the workpiece, comprising: mounting means for mounting the device over the table; a carrier member carried by the mounting means and vertically movable with respect thereto towards and away from the workpiece on the table when the device is mounted over the table; an air-cushion unit carried by the lower end of the carrier member and movable therewith to a proximal position close to the workpiece, or to a distal position remote from the workpiece; and a yieldable link between the mounting means and the air-cushion unit permitting the aircushion unit to move vertically with respect to the mounting means. The air-cushion unit includes an annular skirt defining, with the workpiece when the air-cushion unit is in its proximal position, an air-cushion chamber which is pressurized when the air-cushion chamber is in its proximal position with respect to the workpiece to cause the air-cushion unit to hover over the workpiece in order to permit relative movement between the annular skirt and the workpiece and table, while immobilizing and flattening the workpiece with respect to the table.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

Figure 1:
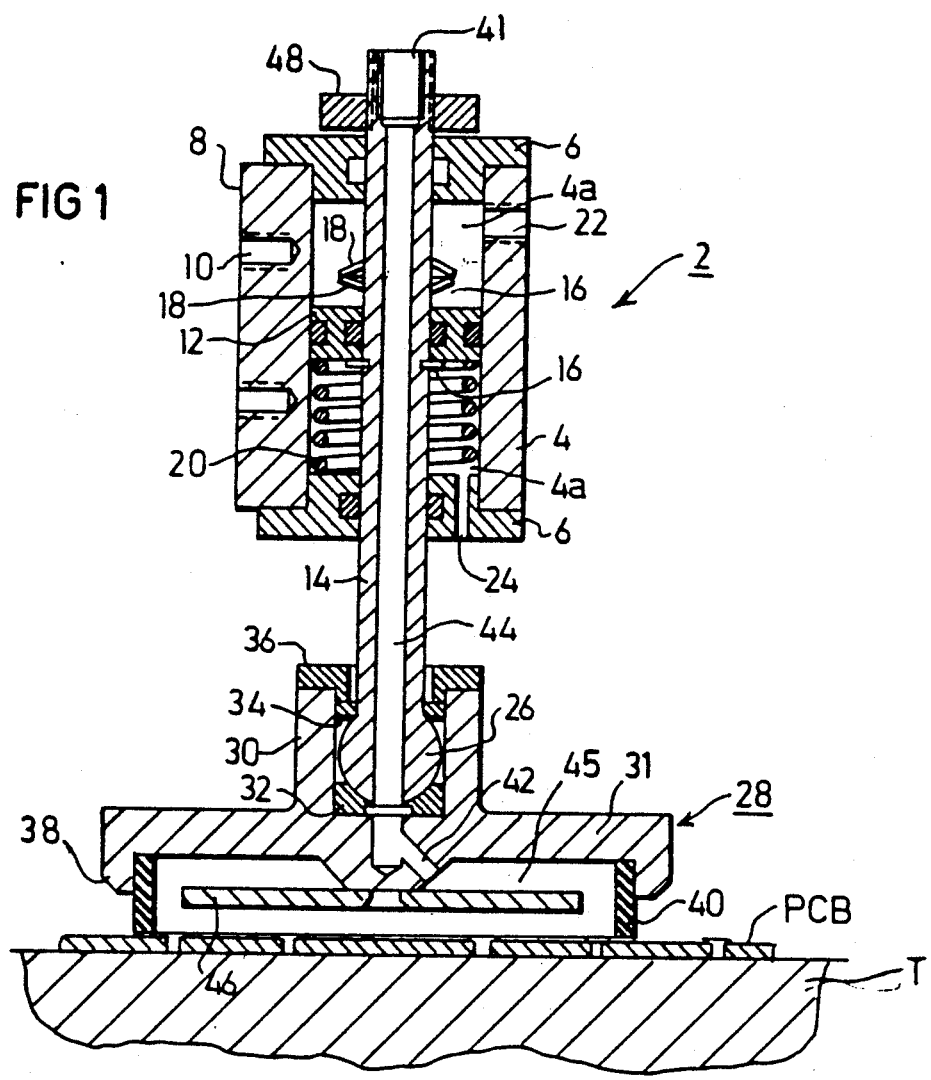
FIG. 1 is a longitudinal sectional view of one form of immobilizing device constructed in accordance with the present invention.

The Embodiment of FIG. 1

FIG. 1 illustrates an immobilizing device, generally designated 2, for mounting over a flat table T adapted to receive a printed circuit board PCB in order to immobilize and flatten the board during testing of the board. Immobilizing device 2 includes a pneumatic cylinder 4 closed at its opposite ends by end plates 6. One surface 8 of cylinder 4 is planar and is provided with threaded holes 10 for attaching the device to a suitable part of the testing equipment.

A piston 12 is displaceable within cylinder 4 and is coupled to a tubular piston rod 14 by retainer washers 16 on opposite sides of the piston so that rod 14 moves with the piston. Two Belleville washers 18 carried by piston rod 14 limit the movement of the piston rod with respect to end plate 6.

Piston rod 12 thus divides the interior of cylinder 4 into a first chamber 4a, and a second chamber 4b, the latter containing a return spring 20. Chamber 4a is pressurized from a source of air (not shown) via inlet 22 to drive piston 12 and its rod 14 through a forward stroke towards table T, thereby contracting chamber 4b (which is permitted by air vent 24) and compressing spring 20; whereas the compressed spring 20 drives the piston and rod through the return stroke away from table T.

Piston rod 14 serves as a carrier member for an air-cushion unit 28 mounted to the lower end of the piston rod by means of a ball 26, integrally formed with the piston rod, received within a neck 30 integrally formed with a mounting member 31 of the air-cushion unit. Ball 26 is rotatably retained with the socket defined by neck 30 by means of a chamfered washer 32 at the inner end of the neck, and another washer 34 at the outer end of the neck retained by a retainer ring 36.

Mounting member 31 further includes a depending annular rib 38, and an annular skirt 40 fixedly attached thereto. Annular skirt 40 may be in the form of a continuous plastic wall, e.g., of a flexible plastic material such as a natural or synthetic elastomer (e.g., neoprene), or of a low friction plastic material, such as "Teflon" (Reg. T.M.).

The upper end of piston rod 14 is formed with an air inlet 41 connected to a source of pressurized air, which may be the same source as supplying air to inlet 22. The lower end of the piston rod communicates with a slanting bore 42 formed through mounting plate 31 conducting the air through bore 44 of the piston rod to an air-cushion chamber 45 defined by annular skirt 40 and the board PCB when the parts are in the position illustrated in FIG. 1. A baffle disc 46 is carried at the lower end of the mounting member 31 to deflect laterally the air flowing via bores 44 and 42.

The upper end of piston rod 14 carries an adjustable stop 48 engageable with the outer face of end plate 6 to limit the downward movement of piston rod 14, and thereby of the air-cushion unit 28 and its annular skirt 40 with respect to the board PCB.

The illustrated device operates as follows:

In the normal condition of the device, i.e., with no air pressure applied to either of the inlets 41 or 22, spring 20 urges piston 12 and its piston rod 14 upwardly and thereby the air-cushion unit 28, carried at the lower end of the piston rod, to its distal position with respect to board PCB, wherein the outer Belleville spring 18 carried by piston rod 14 engages the inner face of end plate 6. In this distal position of the air-cushion unit 28, it is spaced a substantial distance above board PCB, thereby making the upper surface of the table T accessible for applying or removing a board PCB under the air-cushion unit.

Compressed air is first applied via inlet 41 and bores 44 and 42 to chamber 45; and then compressed air is applied via inlet 22 to chamber 4a of cylinder 4. This drives piston 12 and its rod 14 downwardly until stop 48 engages the outer face of end plate 6, which defines the proximal position of the air-cushion unit 28 with respect to the board PCB, shown in FIG. 1. In this proximal position of the air-cushion unit 28, the air pressure within chamber 45 is applied to the surface of the board PCB enclosed by skirt 40 to immobilize and flatten the board with respect to the table T. and at the same time spaces the outer edge of the skirt from the board to permit relative movement between the board and the skirt. In this proximal position, the air applied via inlet 41 escapes via the small annular gap between the outer edge of skirt 40 and the upper face of the board.

The supply of air via inlet 22 is then terminated, whereupon spring 20, compressed during the forward stroke, now acts against piston 12 to drive the piston and its piston rod 14 through a return stroke to the distal position of the air-cushion unit 28, as determined by the engagement of the outer Belleville spring 18 with the inner face of end plate 6. This makes the table surface below the air-cushion unit again accessible for the removal of the board and the application of another board under the air-cushion unit 28.

The ball-and-socket joint (26, 30) between the lower end of piston rod 14 and the air-cushion unit 28 permits the latter unit to tilt with respect to the upper surface of table T receiving the board PCB, and thereby obviates the need for accurately mounting cylinder 4 and guiding the movement of the air-cushion unit 28 carried by it piston rod 14. It will be appreciated, however, !hat such a ball-and-socket joint may be omitted if other means are provided for accurately guiding the movement of the air-cushion unit 28 so that it moves exactly perpendicularly to the upper surface of table T.

Figure 2:
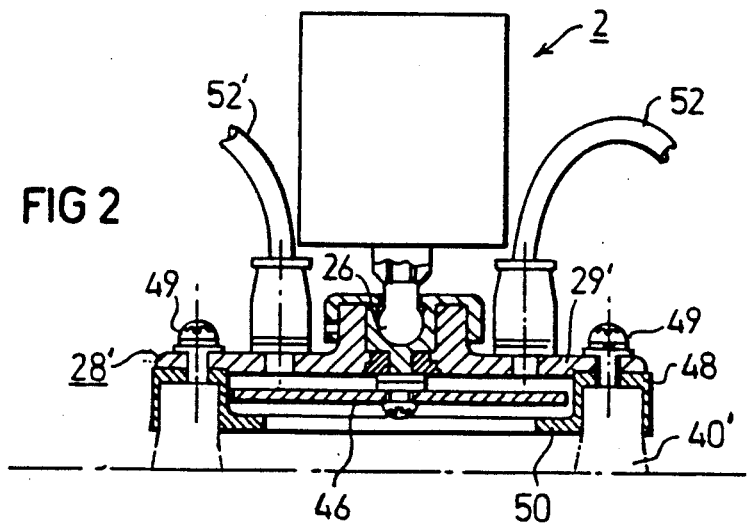
FIG. 2 is a fragmentary view illustrating a modification in the immobilizing device of FIG. 1.

The Variation of FIG. 2

FIG. 2 illustrates a variations wherein the annular skirt carried by the air-cushion unit, designated 28' in FIG. 2, is not of a continuous plastic wall construction as in FIG. 1, but rather is of a brush construction, being formed of a plurality of relatively long, densely-spaced tufts, as indicated at 40' in FIG. 2. The annular brush 40' is fixedly held in a mounting ring 48 attached to the mounting disc 29' of the air-cushion unit 28' by means of screws 49. Mounting ring 48 is provided with an inwardly directed flange 50 underlying baffle 46 which enhances the deflection of the air flow into the air-cushion chamber 45'.

In the variation illustrated in FIG. 2, the air in the air-cushion unit 28' is not supplied centrally through the piston rod (14, FIG. 1), but rather through two air inlets 52, 52' on opposite sides of the mounting plate 31 of the air-cushion unit 28'.

The brush-type skirt illustrated in FIG. 2 has several advantages over the continuous-wall skirt 40 illustrated in FIG. 1, including self-damping which prevents flutter, gentle contact with the delicate conductors, and easy passage across obstacles as locator pins and the like. However, it has the disadvantage of a steeply-rising air consumption with increasing air pressure supplied to the air-cushion chamber 45', and is therefore less suitable for boards with multiple perforations and/or large cutouts that require large air-cushion pressures.

Figure 3:
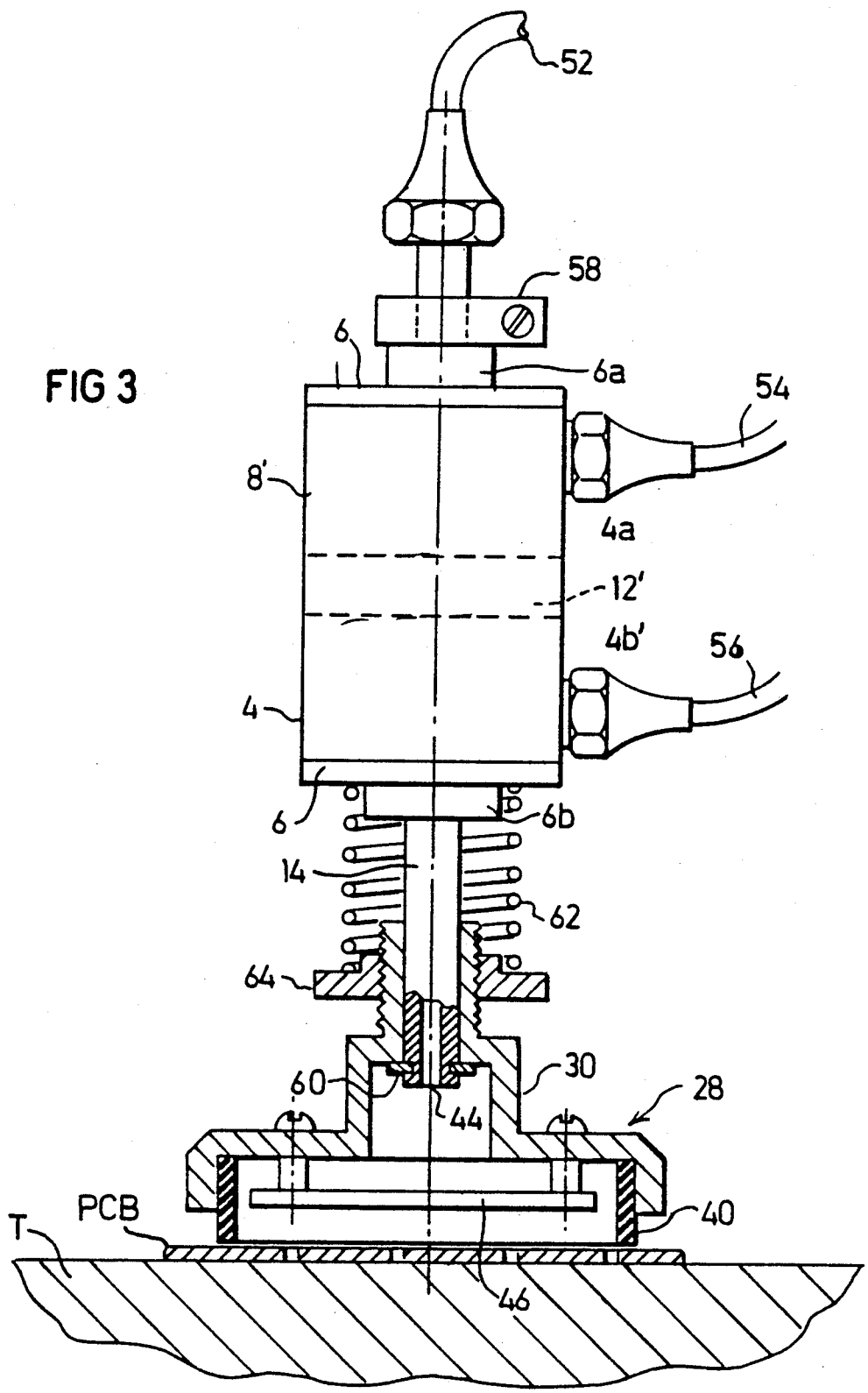
FIGS. 3 and 4 are side elevational views, partly in section, illustrating two further immobilizing devices constructed in accordance with the present invention.

The Embodiment of FIG. 3

FIG. 3 illustrates an immobilizing device wherein the cylinder 4 is of the double-acting type. That is, it includes a piston, shown schematically at 12', which divides the cylinder into the two chambers 4a', 4b', but includes a separate inlet 54, 56 for each chamber. Air introduced via inlet 54 drives the piston 12', and the air-cushion unit 28 carried by its piston rod 14, through a forward stroke to move the air-cushion unit 28 to its proximal position with respect to the board PCB, and air introduced via inlet 56 drives the piston and its air-cushion unit 28 to the distal position with respect to the board. FIG. 3 illustrates the air-cushion unit 28 in its proximal position, as defined by the engagement of adjustable stop 58 carried by the piston rod 14 with the outer face of an annular rib 6a carried by end plate 6 of cylinder 4. The air for producing the air-cushion is applied via inlet 52 and is directed to the air-cushion chamber within unit 28 via bore 44 through the tubular piston rod 14.

The embodiment of FIG. 3 also omits the ball-and-socket joint (26, 30) of FIG. 1. Instead, the air-cushion unit 28 is movable only axially with respect to the tubular piston rod 14, and its movement is limited by a retainer washer 60 secured to the end of the rod.

A helical compression spring 62 is interposed between a circular rib 6b formed in the outer face of the outer end plate 6 and an adjustment nut 64 threadedly received on neck 30 of the air-cushion unit 28. Spring 62 serves as the yieldable link between the cylinder 8' and the air-cushion unit 28, permitting the air-cushion unit to move vertically with respect to the cylinder while hovering over the board PCB in the proximal position of the air-cushion unit with respect to the board. Nut 64 permits the yieldability of this link to be adjusted as may be desired for any particular application.

Figures 4, 5A, 5B, 5C, 5D:
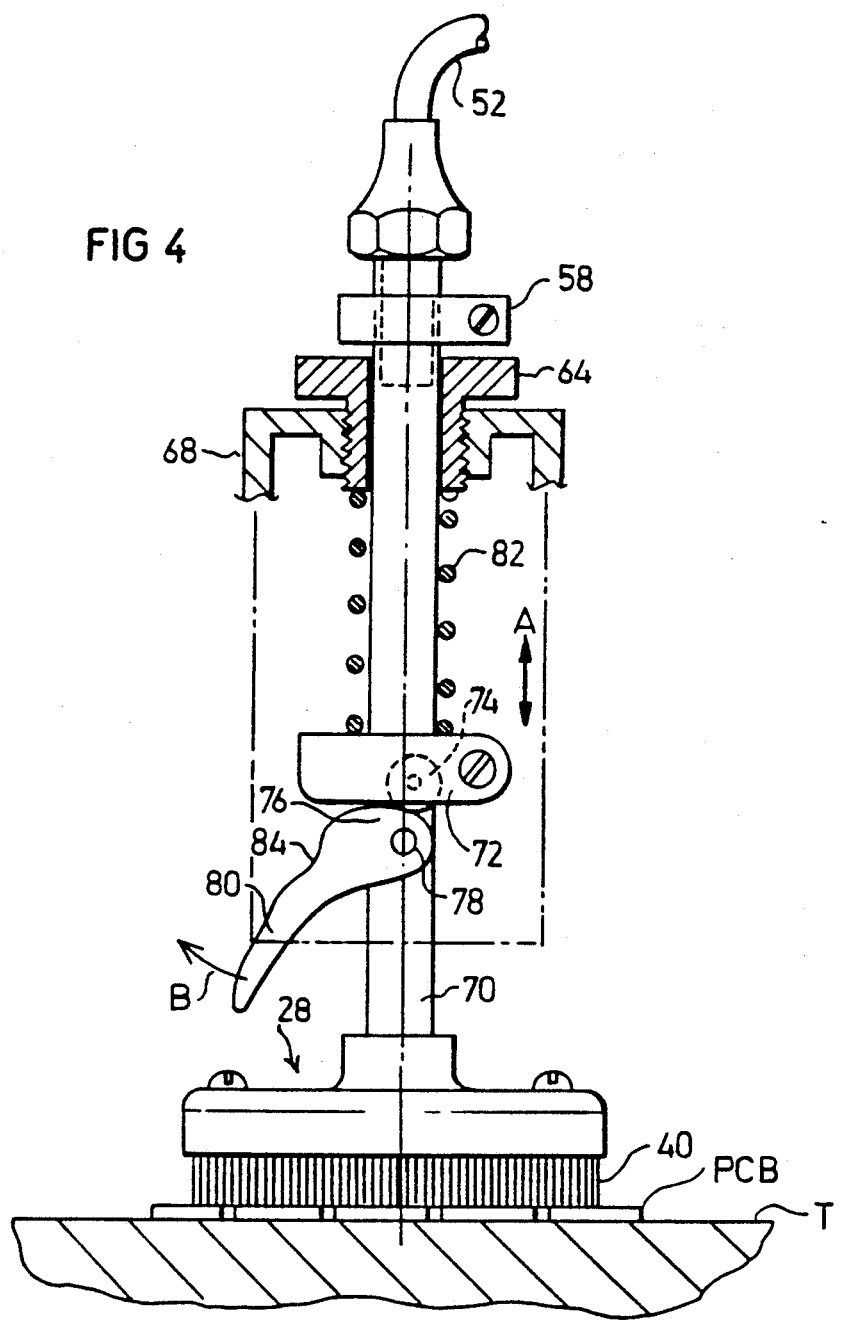
FIGS. 5a–5d illustrate various configurations of annular skirts that may be included in the air-cushion unit or units of the immobilizing device of any of FIGS. 1–4.

The Embodiment of FIG. 4

Whereas the previously-described embodiments of FIGS. 1–3 illustrate an arrangement wherein the housing, defined by the cylinder (4 or 4') includes a pneumatic drive for driving the tubular piston rod (14) carrying the air-cushion unit (28, 28') to its proximal and distal positions with respect to the board PCB, FIG. 4 illustrates the housing, therein designated 68, as including a manual drive for driving the air-cushion unit 28 to its proximal and distal positions.

Thus, in the embodiment of FIG. 4, the carrier 70 for the air-cushion unit 28 is also in the form of a hollow tubular member supplied by pressurized air via inlet 52. A bracket 72 is fixed to carrier member 70 and carries a pair of diametrically-opposed rollers 74 cooperable with cams 76 each pivotally mounted at 78 to the housing 68, and formed with an outwardly-projecting handle 80. A helical compression spring 82, interposed between bracket 72 and the inner face of a collar 64 closing the upper end of housing 68, urges the tubular carrier member 70, and the air-cushion unit 28, to the downward, proximal position of the latter unit with respect to the board PCB, as shown in FIG. 4. Tubular member 70 is movable with respect to housing 68 only axially, i.e., parallel to the longitudinal axis of the tubular member, as shown by arrow A, e.g., by the provision of a spline between the tubular member and housing. Each of the cams 76 further includes a depression 84 in which the cam roller 74 is seated in the raised, distal position of tubular member 70 and its air-cushion unit 28.

It will thus be seen that when handle 80 is in the position illustrated in FIG. 4, the air-cushion unit 28 is in its proximal position with respect to board PCB; but when handle 80 is pivoted about pivot 78 in the direction of arrow B, it raises tubular member 70 and the air-cushion unit 28 carried thereby to the distal position of the latter unit, spaced from the board PCB. The air-cushion unit is retained in this distal position by cam rollers 74 received within depressions 84 of cams 76.

While handle 80 is described above as being manually actuated, it will be appreciated that it could be actuated by a solenoid or the like, in which case it may be desirable to include a dashpot-type damping device for damping the downward movement of the aircushion unit 28. Also, while the air-cushion unit 28 is illustrated in FIG. 4 as having an annular skirt 40' of the brush-type, it will be appreciated that this unit may also include an annular skirt of the continuous-wall type as illustrated in FIGS. 1 and 3.

Examples of Annular Skirt Constructions

The annular skirt (e.g., 40, FIG. 1) of the air-cushion unit may take various configurations, some of which are illustrated in FIGS. 5a–5d. In addition, the immobilizing device may include two (or more) aircushion units each including an annular skirt.

Thus, FIG. 5a illustrates an annular skirt 40a of circular configuration; FIG. 5b illustrates a pair of annular skirts 40b each of circular configuration; FIG. 5c illustrates an annular skirt 40c of an arcuate, oval configuration; and FIG. 4d illustrates two annular skirts each of a relatively narrow, substantially rectangular configuration. The double skirts (FIGS. 5b, 5d) may be mounted on a single carrier member (e.g., tubular piston rod 14, FIG. 1), or on two separate carrier members each independently actuated.

While in the illustrated embodiments the hovering air is introduced into the air-cushion unit in a substantially vertical direction (i.e., through a central inlet or through a plurality of inlets symmetrically arranged around the center), good results can also be obtained when introducing the air in a tangential direction to obtain a swirling motion.

Many other variations, modifications and applications of the invention will be apparent.

what is claimed is:

1. An immobilizing device particularly useful for immobilizing and flattening a substantially planar workpiece on a flat surface of a table during the processing or testing of the workpiece, comprising:

mounting means for mounting the device over the table;

a carrier member carried by said mounting means and vertically movable with respect thereto towards and away from the workpiece on the table when the device is mounted over the table;

an air-cushion unit carried by the lower end of said carrier member and movable therewith to a proximal position close to said workpiece, or to a distal position remote from the workpiece;

and a yieldable link between said mounting means and said air-cushion unit permitting said air-cushion unit to move vertically with respect to said mounting means;

said air-cushion unit including an annular skirt defining, with said workpiece when the air-cushion unit is in its proximal position, an air-cushion chamber, and means effective to pressurize said air-cushion chamber when the air-cushion unit is in its proximal position, to cause the air-cushion unit to hover over the workpiece in order to permit relative movement between the annular skirt and the workpiece and table, while immobilizing and flattening the workpiece with respect to the table.

2. The device according to claim 1, wherein said air-cushion unit comprises an air inlet directing pressurized air towards the upper face of the workpiece when the air-cushion unit is in its proximal position, and a baffle deflecting the inletted air to flow substantially parallel to the upper face of the workpiece and out from the air-cushion unit via an annular space between the outer edge of its annular skirt and the upper face of the workpiece.

3. The device according to claim 1, wherein said annular skirt is a continuous wall of a flexible plastic material.

4. The device according to claim 1, wherein said annular skirt is of a brush construction constituted of a plurality of densely-spaced tufts.

5. The device according to claim 1, wherein said mounting means includes a housing, said housing including a drive for driving the carrier member to its proximal and distal positions.

6. The device according to claim 5, wherein said drive includes a fluid cylinder, and said carrier member includes a piston vertically movable in said cylinder.

7. The device according to claim 6, wherein said fluid cylinder includes a fluid chamber for driving the piston to said proximal position during a forward stroke, and a spring for returning said piston to said distal position during a return stroke.

8. The device according to claim 6, wherein said fluid cylinder includes a first fluid chamber for driving the piston to said proximal position during a forward stroke, and a second fluid chamber for driving the piston to said distal position during a return stroke.

9. The device according to claim 5, wherein said drive includes an operator carried by said housing for moving said carrier member to its proximal and distal positions.

10. The device according to claim 9, wherein said operator comprises a lever pivotally mounted to said housing and having a cam secured thereto, and a bracket fixed to said carrier member and having a cam follower engageable with said cam.

11. The device according to claim 1, further including a stop adjustable on said carrier member and cooperable with said mounting means for fixing said proximal position of the carrier member.

12. The device according to claim 1, wherein said air-cushion unit is mounted to said carrier member by a ball-and-socket mounting.

13. The device according to claim 1, wherein said carrier member comprises a hollow tube through which air is conducted to said air-cushion unit.

14. The device according to claim 1, wherein said annular skirt is of circular configuration.

15. The device according to claim 1, wherein said annular skirt is of oval configuration.

16. The device according to claim 1, wherein said annular skirt is of substantially rectangular configuration.

17. The device according to claim 1, wherein said carrier member carries two air-cushion units each including an annular skirt.

18. An immobilizing device particularly useful for immobilizing and flattening a substantially planar workpiece on a flat surface of a table during the processing or testing of the workpiece, comprising:
   a housing for mounting the device over the table;
   a carrier member carried by said housing and vertically movable with respect thereto towards and away from the workpiece on said table when the device is mounted over the table;
   a spring interposed between said housing and said carrier member permitting said carrier member to move vertically with respect to said housing;
   and an air-cushion unit carried by the lower end of said carrier member and movable therewith to either a proximal position close to the workpiece on the table, or to a distal position remote from the workpiece;
   said air-cushion unit including an annular skirt defining, with the workpiece when the air-cushion unit is its proximal position, an air-cushion chamber, and means effective to pressurize said air-cushion chamber when the air-cushion unit is in its proximal position, to cause the air-cushion unit to hover over the workpiece while immobilizing and flattening it with respect to the table.

19. The device according to claim 18, wherein said housing includes a pneumatic drive for driving said carrier member and said air-cushion unit to its proximal and distal positions.

20. The device according to claim 18, wherein said housing includes a manual drive for manually driving said carrier member and its air-cushion unit to its proximal and distal positions.

* * * * *